United States Patent
O et al.

(10) Patent No.: US 7,279,952 B1
(45) Date of Patent: Oct. 9, 2007

(54) VOLTAGE CLAMP CIRCUIT WITH REDUCED I/O CAPACITANCE

(75) Inventors: Hugh Sungki O, Fremont, CA (US); Chih-Ching Shih, Pleasanton, CA (US); Cheng-Hsiung Huang, Cupertino, CA (US); Yow-Juang (Bill) Liu, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 11/223,270

(22) Filed: Sep. 9, 2005

(51) Int. Cl.
*H03K 5/08* (2006.01)

(52) U.S. Cl. .................. 327/320; 327/325; 327/333

(58) Field of Classification Search ................ 327/320, 327/325, 333
See application file for complete search history.

(56) References Cited

U.S. PATENT DOCUMENTS 6,577,480 B1 *  6/2003  Avery et al. ................... 361/56
6,614,633 B1 *  9/2003  Kohno ......................... 361/56
7,046,079 B2 *  5/2006  Van Blerkom et al. ..... 327/543

* cited by examiner

Primary Examiner—Kenneth B. Wells
(74) Attorney, Agent, or Firm—Morgan, Lewis & Bockius LLP

(57) ABSTRACT

A voltage converter includes a first N-channel MOSFET transistor, an inverter, a plurality of serially-connected diodes and a second N-channel MOSFET transistor. The inverter is coupled to the gate of the first N-channel MOSFET transistor to turn on/off the voltage converter. The anode of the diodes is coupled to the source of the first N-channel MOSFET transistor and the cathode of the diodes are coupled to the drain of the second N-channel MOSFET transistor. Since the source of the second N-channel MOSFET transistor is ground, the voltage clamped at the source of the first N-channel MOSFET transistor is not higher than 3.4V when a high voltage applied to the gate of the second N-channel MOSFET transistor turns it on.

19 Claims, 3 Drawing Sheets

VOLTAGE CLAMP CIRCUIT WITH REDUCED I/O CAPACITANCE

FIELD OF THE INVENTION

The present invention relates generally to the field of integrated circuit (IC) design, and in particular, to a new voltage clamp circuit with reduced I/O capacitance.

BACKGROUND

As a result of the development of low-voltage technology, a multi-component electronic system may operate in a mixed mode, i.e., some components operating at a voltage level of 3.3V and some components operating at a voltage level of 5V. Conversion between the two voltage levels is often necessary to prevent damage to the 3.3V components. In view of the above, it is desirable to develop a voltage clamping mechanism to protect the 3.3V components from being exposed to high voltage.

SUMMARY

In a preferred embodiment of the present invention, a voltage converter includes a first N-channel MOSFET transistor, an inverter, a plurality of serially-connected diodes and a second N-channel MOSFET transistor. The inverter is coupled to the gate of the first N-channel MOSFET transistor to turn on/off the voltage converter. The anode of the serially-connected diodes is coupled to the source of the first N-channel MOSFET transistor and the cathode of the serially-connected diodes are coupled to the drain of the second N-channel MOSFET transistor. Since the source of the second N-channel MOSFET transistor is ground, the voltage clamped at the source of the first N-channel MOSFET transistor is not higher than 3.4V when a high voltage applied to the gate of the second N-channel MOSFET transistor turns it on.

BRIEF DESCRIPTION OF THE DRAWINGS

The aforementioned aspects of the invention as well as additional aspects will be more clearly understood as a result of the following detailed description of the various embodiments of the invention when taken in conjunction with the drawings.

Like reference numerals refer to corresponding parts throughout the several views of the drawings.

DETAILED DESCRIPTION OF EMBODIMENTS

Figure 1:
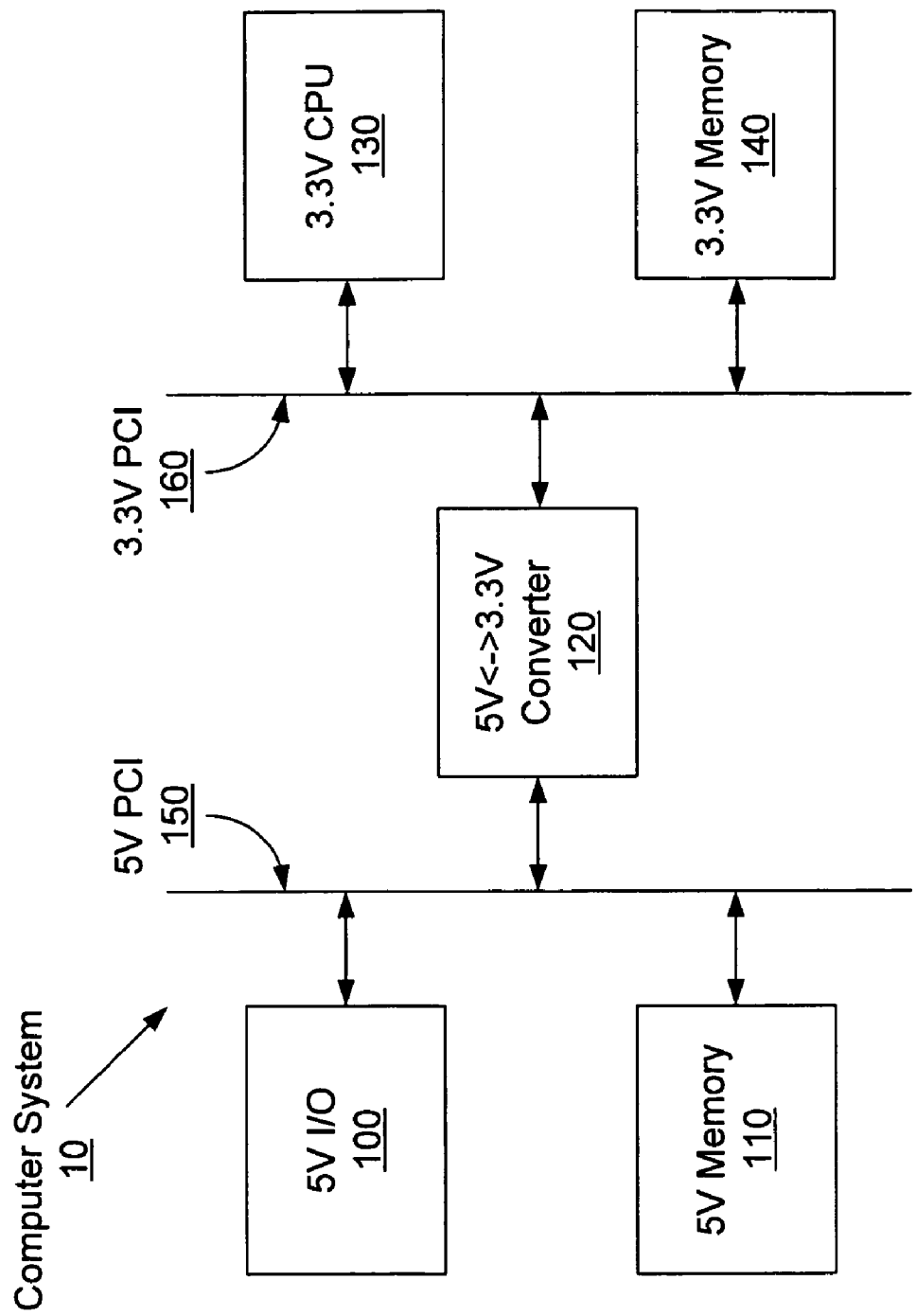
FIG. 1 is a prior art diagram illustrating a computer system including a mixture of 5V and 3.3V components.

FIG. 1 is a prior art diagram illustrating a computer system. For illustrative purposes, the computer system 10 includes a 3.3V CPU 130 and at least one 3.3V memory device 140. These 3.3V components are coupled to a 3.3V Peripheral Component Interconnect (PCI) 160. The peripheral component interconnect is a computer bus standard and it has specifications supporting multiple voltage levels including 3.3V and 5V.

The computer system also includes a 5V I/O device 100 and a 5V memory device 110. These 5V devices are coupled to a 5V PCI 150. A 5V-to-3.3V voltage converter 120 couples the 5V PCI 150 to the 3.3V PCI 160 in order to protect the 3.3V components from being exposed to 5V voltage.

Figure 2:
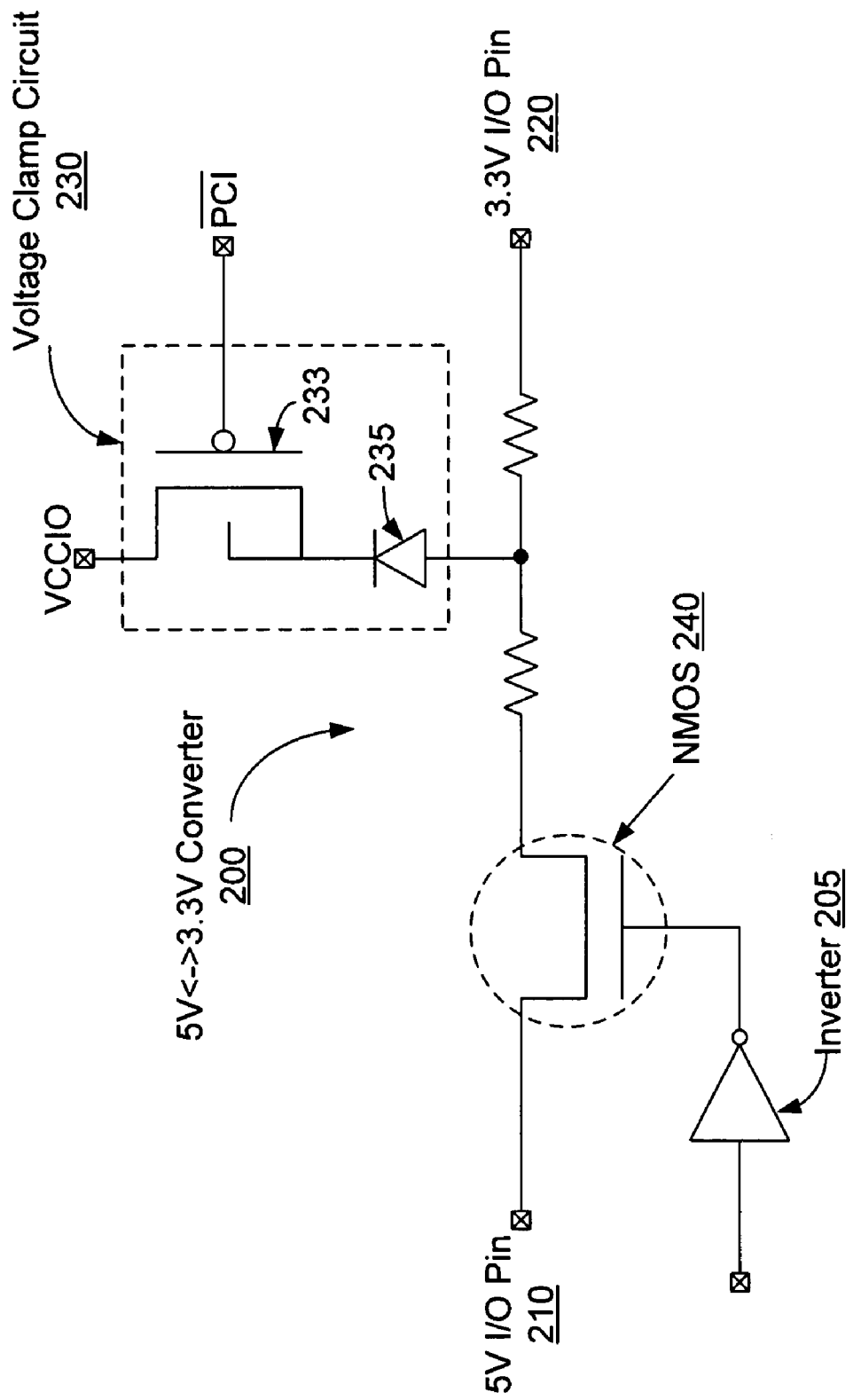
FIG. 2 is a diagram illustrating a 5V-to-3.3V voltage converter including a prior art voltage clamp circuit.

FIG. 2 is a diagram illustrating the structure of a 5V-to-3.3V voltage converter 200 that can be used in the computer system 10. The core of the 5V-to-3.3V voltage converter 200 is an N-channel MOSFET transistor 240. The N-channel MOSFET transistor 240 has a drain, a gate and a source. Its drain and source are coupled to a 5V I/O pin 210 and a 3.3V I/O pin 220, respectively, and its gate is coupled to an inverter 205. The inverter 205 serves as the on/off gate of the voltage converter 200. Logic "0" applied to the input of the inverter 205 turns on the transistor 240 while logic "1" applied to the input of the inverter 205 turns it off.

The 5V-to-3.3V voltage converter 200 also includes a voltage clamp circuit 230 coupled to the source of the transistor 240 to prevent high voltage appearing at the 3.3V I/O pin 220. The voltage clamp circuit 230 includes a diode 235 and a P-channel MOSFET transistor 233. The anode of the diode 235 is coupled to the source of the transistor 240 and its cathode is coupled to the drain of the transistor 233. The source of the transistor 233 is coupled to the I/O power supply VCCIO and its gate is coupled to a bus control signal PCI.

It will be apparent to one skilled in the art that the drain and source of the transistor 240 are interchangeable. In an alternative embodiment, both the drain of the transistor 240 and the voltage clamp circuit 230 are coupled to the 3.3V I/O pin while the source is coupled to the 5V I/O pin. A 5V voltage applied to the source of the transistor 240 is then converted to a 3.3V voltage at the drain of the transistor 240.

When the 5V-to-3.3V voltage converter 200 is enabled, the gate of the transistor 233 needs be terminated at ground level. In this case, the voltage clamped at the I/O pin 220 can be as high as about 4.3V and the current flowing through the diode 235 is about 25 mA. Since this clamped voltage is about one volt higher than the 3.3 voltage standard, it may damage the gate oxide layer of the transistor 233 and therefore reduce the lifetime of the 5V-to-3.3V voltage converter 200. This high clamped voltage may even damage any circuit (not shown in FIG. 2) connected to the 3.3V I/O pin and shorten its lifetime. In addition, since the gate of the transistor 233 is terminated at the power supply VCCIO, any stability issue associated with the power supply VCCIO may have an adverse impact on the performance of the voltage clamp circuit 230 and other circuits connected to the voltage clamp circuit 230.

Figure 3:
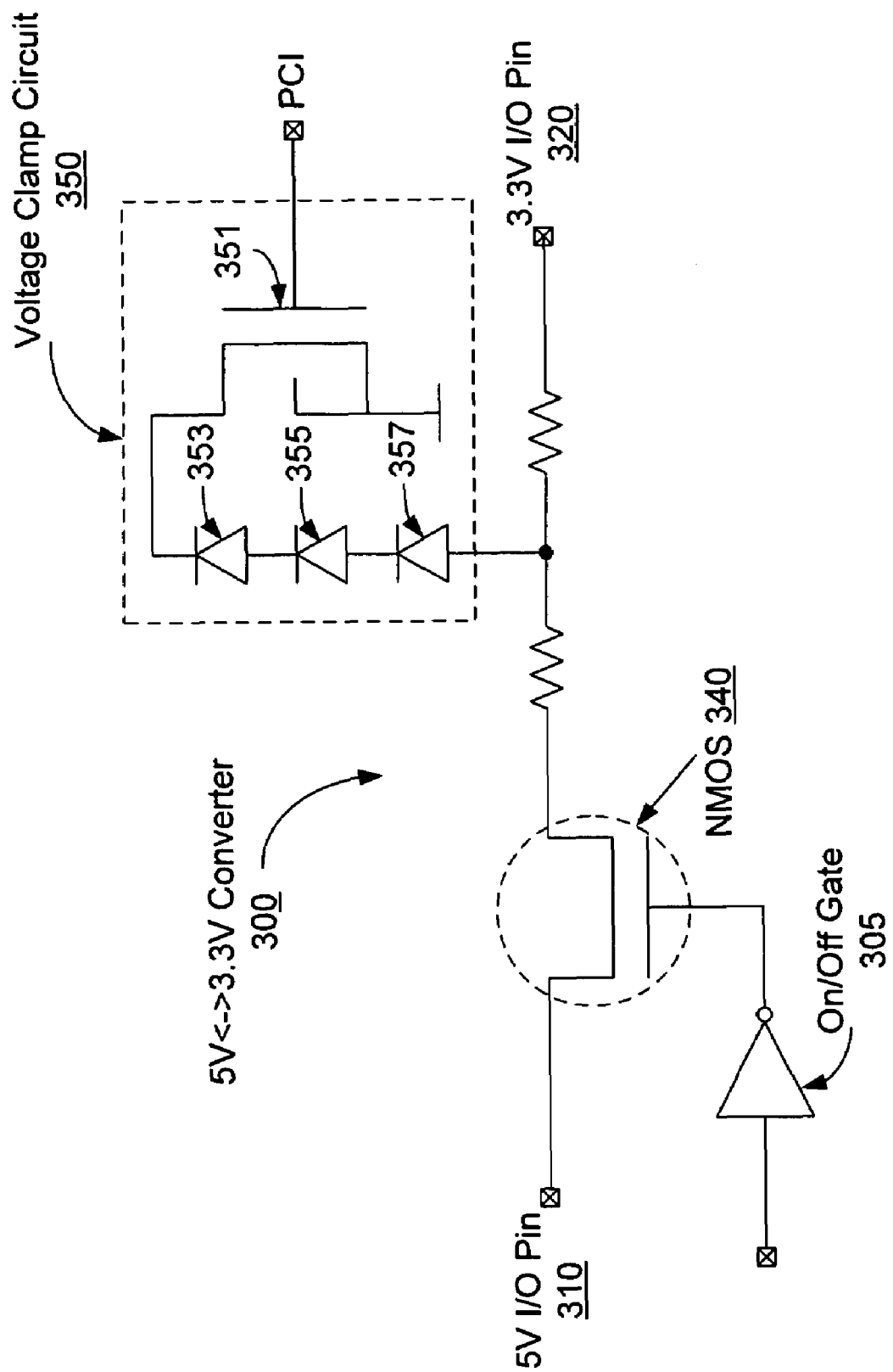
FIG. 3 is a diagram illustrating a 5V-to-3.3V voltage converter including a voltage clamp circuit according to some embodiments of the present invention.

The present invention is directed to a new voltage clamp circuit structure that demonstrates a substantial improvement over the one shown in FIG. 2. As shown in FIG. 3, the voltage clamp circuit 350 comprises three serially connected diodes 353, 355 and 357 as well as an N-channel MOSFET transistor 351. In particular, the anode of the diode 357 is coupled to the source of the N-channel MOSFET transistor 340 and the cathode of the diode 353 is coupled to the drain of the transistor 351. The source of the transistor 351 is ground and a bus control signal PCI is applied to the gate of the transistor 351.

When the 5V-to-3.3V voltage converter 300 is enabled, the gate of the transistor 351 is terminated at a high voltage level, e.g., 3.3V, to turn on the transistor 351. In this embodiment, since the voltage drop across each of the diodes 353, 355 and 357 is about 1V and the threshold voltage of the transistor 351 is about 0.4V, the voltage clamped at the I/O pin 320 is not higher than 3.4V, i.e., 1V+1V+1V+0.4V. But the current flowing through the three diodes is still about 25 mA. This clamped voltage is significantly lower than that of the voltage clamp circuit 230 shown in FIG. 2. As a result, the gate oxide layer of the transistor 351 and any circuit (not shown in FIG. 3) connected to the 3.3V I/O pin are less likely to be damaged by high voltage and their lifetime is substantially improved. In some embodiments, the lifetime of the voltage converter 300 in FIG. 3 is at least 200 times longer than that of the voltage converter 200 in FIG. 2. Moreover, since the source of the transistor 351 is ground, the stability of the power supply VCCIO is no longer an issue affecting the performance of the voltage clamp circuit 350. Both the voltage clamp circuit 350 and other circuits connected to the voltage clamp circuit 350 are free from noise introduced by the power supply VCCIO.

Another feature of the voltage clamp circuit 350 is that it is physically smaller than the voltage clamp circuit 230. In other words, the voltage clamp circuit 350 has a smaller footprint on a semiconductor substrate than the circuit 230 and it therefore has a lower I/O capacitance. Advantageously, a physically smaller and low-capacitance voltage clamp circuit helps to improve the performance of an I/O device it is associated with.

As an example, Table 1 lists the widths of various components of the voltage clamp circuits 230 and 350 according to one embodiment.

TABLE 1

Widths of Voltage Clamp Circuits 230 and 350

| | | |
|---|---|---|
| Voltage Clamp Circuit 230 | Diode 235<br>240 μm | Transistor 233<br>900 μm |
| Voltage Clamp Circuit 350 | Diode 353, 355, 375 (Each)<br>60 μm | Transistor 351<br>450 μm |

Generally, the physical dimension of a voltage clamp circuit can be measured by the sum of the widths of various components constituting the circuit. Therefore, the size of the voltage clamp circuit 350 is only about half of that of the voltage clamp circuit 230, $$\Delta_{size}=(450+60\times3)/(900+240)\approx55\%.$$

In contrast, the I/O capacitance of diode(s) within a voltage clamp circuit roughly constitutes the I/O capacitance of the circuit. Since the three diodes in the voltage clamp circuit 350 are serially connected, the I/O capacitance of the voltage clamp circuit is only about one-third of that of an individual diode. In other words, the size reduction of the voltage clamp circuit 350 results an even more significant reduction of I/O capacitance. In this particular example, the I/O capacitance of the voltage clamp circuit 350 is less than one-tenth of that of the voltage clamp circuit 230, $$\Delta_{Capacitance}=(60/3)/240\approx8\%.$$

The foregoing description, for purpose of explanation, has been set forth with reference to specific embodiments. However, the illustrative discussions above are not intended to be exhaustive or limit the invention to the precise forms disclosed. For example, one skilled in the art will appreciate that the voltage clamp circuit 350 can be easily modified to be used in 2.5V or 1.8V low-voltage I/O standard by changing the number and/or size of the clamping diodes. Still other variations will be obvious to one of ordinary skill in the art.

What is claimed is:

1. An electronic device, comprising:
   a first N-channel MOSFET transistor having a drain, a source and a gate wherein the drain is coupled to a high voltage PCI communication bus;
   a plurality of serially-connected diodes having an anode and a cathode, wherein the anode of the diodes is coupled to the source of the first N-channel MOSFET transistor; and
   a second N-channel MOSFET transistor having a drain, a source and a gate, wherein the drain of the second N-channel MOSFET transistor is coupled to the cathode of the diodes and the source of the second N-channel MOSFET transistor is coupled to ground.

2. The electronic device of claim 1, further comprising an inverter coupled to the gate of the first N-channel MOSFET transistor, the inverter configured to turn on/off the first N-channel MOSFET transistor.

3. The electronic device of claim 1, wherein the source of the first N-channel MOSFET transistor is coupled to a low voltage PCI communication bus.

4. The electronic device of claim 1, wherein the drain of the first N-channel MOSFET transistor is coupled to a 5V PCI communication bus and the source of the first N-channel MOSFET transistor is coupled to a 3.3V PCI communication bus.

5. The electronic device of claim 1, wherein the plurality of serially-connected diodes include three diodes.

6. The electronic device of claim 1, wherein the source of the first N-channel MOSFET transistor is clamped to a voltage not higher than 3.4V when the gate of the second N-channel MOSFET transistor is terminated at a high voltage level.

7. An electronic device, comprising:
   a voltage converter comprising a first N-channel MOSFET transistor having a drain, a source and a gate and an inverter coupled to the gate of the transistor; and
   a voltage clamp circuit coupled to the output terminal of the voltage converter, the voltage clamp circuit including:
     at least three serially-connected diodes having an anode and a cathode, wherein the anode of the diodes is coupled to the output terminal of the voltage converter; and
     a second N-channel MOSFET transistor having a drain, a source and a gate, wherein the drain of the second N-channel MOSFET transistor is coupled to the cathode of the diodes and the source of the second N-channel MOSFET transistor is coupled to ground.

8. The electronic device of claim 7, wherein the inverter is configured to turn on/off the first N-channel MOSFET transistor.

9. The electronic device of claim 7, wherein the drain of the first N-channel MOSFET transistor is coupled to a 5V PCI communication bus.

10. The electronic device of claim 7, wherein the source of the first N-channel MOSFET transistor is coupled to a 3.3V PCI communication bus.

11. The electronic device of claim 7, wherein the source of the first N-channel MOSFET transistor is clamped to a voltage not higher than 3.4V when the gate of the second N-channel MOSFET transistor is terminated at a 3.3V voltage level.

12. A method of clamping voltage, comprising:
   coupling a first I/O pin of a voltage converter to a high-voltage device and a second I/O pin of the voltage converter to a low-voltage device; and coupling a voltage clamp circuit to the second I/O pin of the voltage converter, where the voltage clamp circuit includes:
  a plurality of serially-connected diodes having an anode and a cathode, wherein the anode of the diodes is coupled to the second I/O pin of the voltage converter; and
  a first N-channel MOSFET transistor having a drain, a source and a gate, wherein the drain is coupled to the cathode of the diodes and the source is ground.

13. The method of claim 12, wherein the voltage converter includes:
  a second N-channel MOSFET transistor having a drain, a source and a gate; and
  an inverter coupled to the gate of the second N-channel MOSFET transistor.

14. The method of claim 13, further comprising:
  turning on/off the second N-channel MOSFET transistor by applying a predetermined voltage to the inverter.

15. The method of claim 13, wherein the drain of the second N-channel MOSFET transistor is coupled to a 5V PCI communication bus.

16. The method of claim 13, wherein the source of the second N-channel MOSFET transistor is coupled to a 3.3V PCI communication bus.

17. The method of claim 13, wherein the plurality of serially-connected diodes include three diodes.

18. The method of claim 17, further comprising:
  clamping the source of the second N-channel MOSFET transistor to a voltage of not higher than 3.4V by applying a high voltage to the gate of the first N-channel MOSFET transistor.

19. An electronic device, comprising:
  a first N-channel MOSFET transistor having a drain, a source and a gate wherein the source is coupled to a low voltage PCI communication bus;
  a plurality of serially-connected diodes having an anode and a cathode, wherein the anode of the diodes is coupled to the source of the first N-channel MOSFET transistor; and
  a second N-channel MOSFET transistor having a drain, a source and a gate, wherein the drain of the second N-channel MOSFET transistor is coupled to the cathode of the diodes and the source of the second N-channel MOSFET transistor is coupled to ground.

* * * * *